United States Patent

Yasudaa et al.

[11] Patent Number: 5,670,844
[45] Date of Patent: Sep. 23, 1997

[54] DISCHARGE LAMP

[75] Inventors: Yukio Yasudaa; Kiyotada Nakamura, both of Himeji, Japan

[73] Assignee: Ushiodenki Kabushiki Kaisha, Chiyoda-ku, Japan

[21] Appl. No.: 492,948

[22] Filed: Jun. 21, 1995

[30] Foreign Application Priority Data

Jun. 21, 1994 [JP] Japan .................................. 6-160791
Jun. 21, 1994 [JP] Japan .................................. 6-160792

[51] Int. Cl.$^6$ .............................. H01J 17/16; H01J 61/30
[52] U.S. Cl. ........................ 313/636; 313/571; 313/639; 313/642
[58] Field of Search ................................ 313/568, 570, 313/571, 572, 637, 638, 639, 636, 642

[56] References Cited

U.S. PATENT DOCUMENTS 4,156,826  5/1979  Hemqvist .............................. 313/636
5,541,481  7/1996  Yamaguchi et al. .................... 313/628

FOREIGN PATENT DOCUMENTS 2265251  9/1993  United Kingdom .................... 313/568

*Primary Examiner*—Nimeshkumar Patel
*Attorney, Agent, or Firm*—Sixbey, Friedman, Leedom & Ferguson, P.C.; David S. Safran

[57] ABSTRACT

A good discharge lamp which can emit light with wavelengths in the range of 220 nm in an amount sufficient for industrial applications and at the same time can adequately maintain a transmission factor of the radiant light and emits neither water nor hydrogen or the like during luminous operation is achieved by the fact that, in a discharge lamp in which a pair of electrodes are located adjacent to one another encapsulated within a quartz glass fluorescent tube together with mercury and an inert gas, the quartz glass contains an OH radical concentration of a weight of in the range of 300 to 800 ppm. Furthermore, the content of metallic impurities in the quartz glass is limited to a weight less than or equal to 1 ppm.

6 Claims, 4 Drawing Sheets

FIG. 2

| Lamp | OH concentration in the quartz glass (wt. ppm) | Radiant exposure density | Capability |
|---|---|---|---|
| a | 0.5 | 0.8 | X |
| b | 1 | 0.8 | X |
| c | 100 | 0.9 | X |
| d | 300 | 1 | O |
| e | 700 | 1 | O |
| f | 800 | 1 | O |
| g | 900 | 1 | Premature blackening of the fluores. tube |

FIG. 3

| Lamp | Metallic impurities in the quartz glass (wt-ppm) | Radiant density exposure | Capability |
|---|---|---|---|
| h | 0.5 | 1 | O |
| i | 1.0 | 1 | O |
| j | 10 | 0.8 | X |
| k | 20 | 0.7 | X |
| l | 30 | 0.5 | X |

FIG. 4

| Lamp No. | En-cap. amt. of pres. | Xen-on pres. | Lamp volt. | Lamp curr. | Lamp power input | Rel. rad. expo. den. | Rel. illum- effici- ency | Cap- abil. |
|---|---|---|---|---|---|---|---|---|
| 1 | 5 | 0.5 | 19.6 | 80 | 1.6 | 56 | 35.0 | X |
| 2 | 14 | 0.5 | 25.8 | 80 | 2.1 | 98 | 46.7 | O |
| 3 | 20 | 0.1 | 27.0 | 70 | 1.9 | 90 | 47.4 | O |
| 4 | 20 | 0.3 | 28.0 | 70 | 2.0 | 100 | 50.0 | O |
| 5 | 20 | 0.5 | 29.0 | 70 | 2.0 | 107 | 53.5 | O |
| 6 | 20 | 3 | 31.2 | 70 | 2.2 | 107 | 48.6 | O |
| 7 | 20 | 5 | 31.5 | 70 | 2.2 | 100 | 45.5 | O |
| 8 | 20 | 8 | 32.8 | 60 | 2.0 | 74 | 37.0 | X |
| 9 | 30 | 0.5 | 33.3 | 64 | 2.1 | 95 | 45.2 | O |
| 10 | 40 | 0.5 | 35.0 | 57 | 2.0 | 66 | 33.0 | X |

DISCHARGE LAMP

BACKGROUND OF THE INVENTION

1. Field of the invention

The invention relates to a discharge lamp which emits ultraviolet rays with wavelengths in the range of 250 nm. The invention relates in particular to a discharge lamp which is used for a Semiconductor exposure device.

2. Description of Related Art

In exposure of a circuit pattern with no more than 1 Mbits, light with a wavelength of 436 nm is used which is called a g-ray. At a higher degree of integration, light with a wavelength of 365 nm is used, which is called an i-ray. As light sources, mercury lamps with the emission spectra of the mercury are used.

On the other hand, as a result of the very advanced development of ultra-LSI, there has recently been a strong demand for light with wavelengths even shorter than the i-ray or g-ray. To satisfy this demand, lasers have been considered as a light source instead of a lamp, and specifically a KrF laser or the like is being studied for practical use. This KrF laser is used specifically for exposure of a circuit with roughly 256 MDRAM.

However, an exposure device using a laser has the following disadvantages:

Interference between the resist layer thicknesses occurs on a wafer. As the result of the occurrence of this interference, greater resolution of a circuit pattern becomes difficult.

Furthermore, due to its emission as a pulse, the laser light damages optical system lenses and mirrors, and shortens their service life.

Based on the above described circumstances, tests have also been run to use lamps, as in the past, to meet the demand for short wavelength light.

In this case, in a lamp which emits an i-ray or g-ray, quartz glass with an extraordinarily low OH radical is used as the fluorescent tube. This means that, as the result of the low water content Which is contained in the quartz glass, at a high temperature during luminous operation, oxygen, hydrogen or water is also formed only in a small amount from the quartz glass. On the one hand, there is the disadvantage that the service life of the lamp is shortened when oxygen, hydrogen, water or the like form, since in the fluorescent tube they become impurity gases, because, for example, the oxygen oxidizes the electrodes.

On the other hand, a color center occurs on quartz glass having a low OH radical concentration when short wavelength light is transmitted. A color center is defined as a phenomenon in which, due to the short wavelength light, a type of lattice defect occurs within the quartz glass. This lattice defect does not occur to any great degree at the wavelengths of the i-ray or the g-ray, but at a wavelength of roughly 250 nm, clearly occurs. This color center in the quartz glass generates distortion, and as a result, reduces the transmission factor of ultraviolet rays.

This means that it is necessary to suitably determine an amount of the OH radical contained in the quartz glass with consideration of the formation of water or the like and of a color center in order to emit short wavelength light with a wavelength of roughly 250 nm.

On the other hand, to produce a lamp which emits light with wavelengths in the range of 250 nm, studies of the materials to be encapsulated and encapsulation amounts for this purpose are done.

For example, in Japanese patent specification SHO 62-2428, it is described that by determining of the encapsulation quantities of mercury and of inert gas, light with wavelengths of 200 to 250 nm can be emitted with great intensity. Specifically, it is described that it is desirable to fix the encapsulation amount of mercury per fluorescent tube volume M (mg/cc) in a range of $1 \leq M \leq 13$ and an encapsulation pressure P of the inert gas in a range of $0.1 \times 10^5 \leq P \leq 1 \times 10^6$.

The encapsulation quantity described in this case is certainly effective for experimental applications, but for industrial applications it is not adequate. One presumable reason for this is that the amount of the above described OH radical is not suitable. Another presumable reason is that, in the case of the encapsulation amount of mercury described here, a sufficient mercury density which can contribute to emission cannot be obtained.

If, using the above described lamp, an exposure process is accomplished, therefore, as the result of its low radiation intensity, a reduction of the flow rate, and as the result, a decrease of productivity are caused. This disadvantage can certainly be eliminated by increasing the turn-on power for the lamp; however, this causes the device to become larger. Furthermore, thermal damage of the various parts which form the device occurs since the heat emitted from the lamp also increases.

This means that there is a need for a lamp which emits light with wavelengths in the range of 250 nm with as little power as possible and high efficiency.

SUMMARY OF THE INVENTION

Therefore, the primary object of the invention is to devise a good discharge lamp which can emit light with wavelengths in the range of 250 nm in an amount sufficient for industrial applications and which, at the same time, can adequately maintain a transmission factor of the radiant light even with uninterrupted luminous operation of the lamp and without emitting either water, hydrogen or the like during luminous operation.

The object is achieved, according to a preferred embodiment of the invention, in a discharge lamp in which, within a quartz glass fluorescent tube, a pair of electrodes are located adjacent to one another and mercury and an inert gas are encapsulated by the following measures:

(1) In the quartz glass, the OH radical is contained with a weight of 300 to 800 ppm.

(2) In the quartz glass there is a content of metallic impurities at a weight of less than or equal to 1 ppm.

The problem is solved according to the invention, furthermore, by the following features in order to more efficiently emit light with wavelengths in the 250 nm range.

(1) Encapsulated within the fluorescent tube are 14 mg to 30 mg mercury/cm$^3$ of fluorescent tube internal volume, and as the inert gas, xenon or krypton at a reference temperature of 25° C. and a pressure of $0.1 \times 10^5$ Pa to $5.0 \times 10^5$ Pa. or (2) Encapsulated within the fluorescent tube are 14 mg to 30 mg mercury/cm$^3$ of fluorescent tube internal volume, and as the inert gas, argon at a reference temperature of 25° C. and a pressure of $0.03 \times 10^5$ Pa to $5.0 \times 10^5$ Pa.

This means that, according to the invention, by determining the mounts of mercury and the inert gas which are encapsulated in the fluorescent tube, a lamp can be obtained which emits light with wavelengths in the range of 250 nm. Furthermore, according to the invention, by determining the OH radical content in the quartz glass, the transmission factor of the light with wavelengths in the range of 250 nm can be maintained at a stipulated value over a long time.

The inventors have ascertained by intensive research that, by adjusting the OH radical content in the quartz glass which forms the fluorescent tube to the above described quantitative range, both emission of water or hydrogen during luminous operation and also the occurrence of a color center in the quartz glass can be prevented even if the transmitted light has a short wavelength in the 250 nm range.

Furthermore, the inventors have found as a new result that fixing the encapsulation amounts of the mercury and the inert gas to stipulated numerical values is effective for emitting light with wavelengths in the range of 250 nm with an intensity sufficient for industrial applications.

BRIEF DESCRIPTION OF THE DRAWINGS

FIG. 2 is a table showing the ratio between the content of the OH radical contained in the quartz glass and the illumination intensity;

FIG. 3 is a table showing the relationship between the concentration of the metallic impurities contained in the quartz glass and the illumination intensity of the lamp;

FIG. 4 is a table showing the ratio between the encapsulation amount of mercury and the inert gases which are contained in the emission part and the illumination intensity in a wavelength range of from 240 to 254 nm.

DETAILED DESCRIPTION

Figure 1:
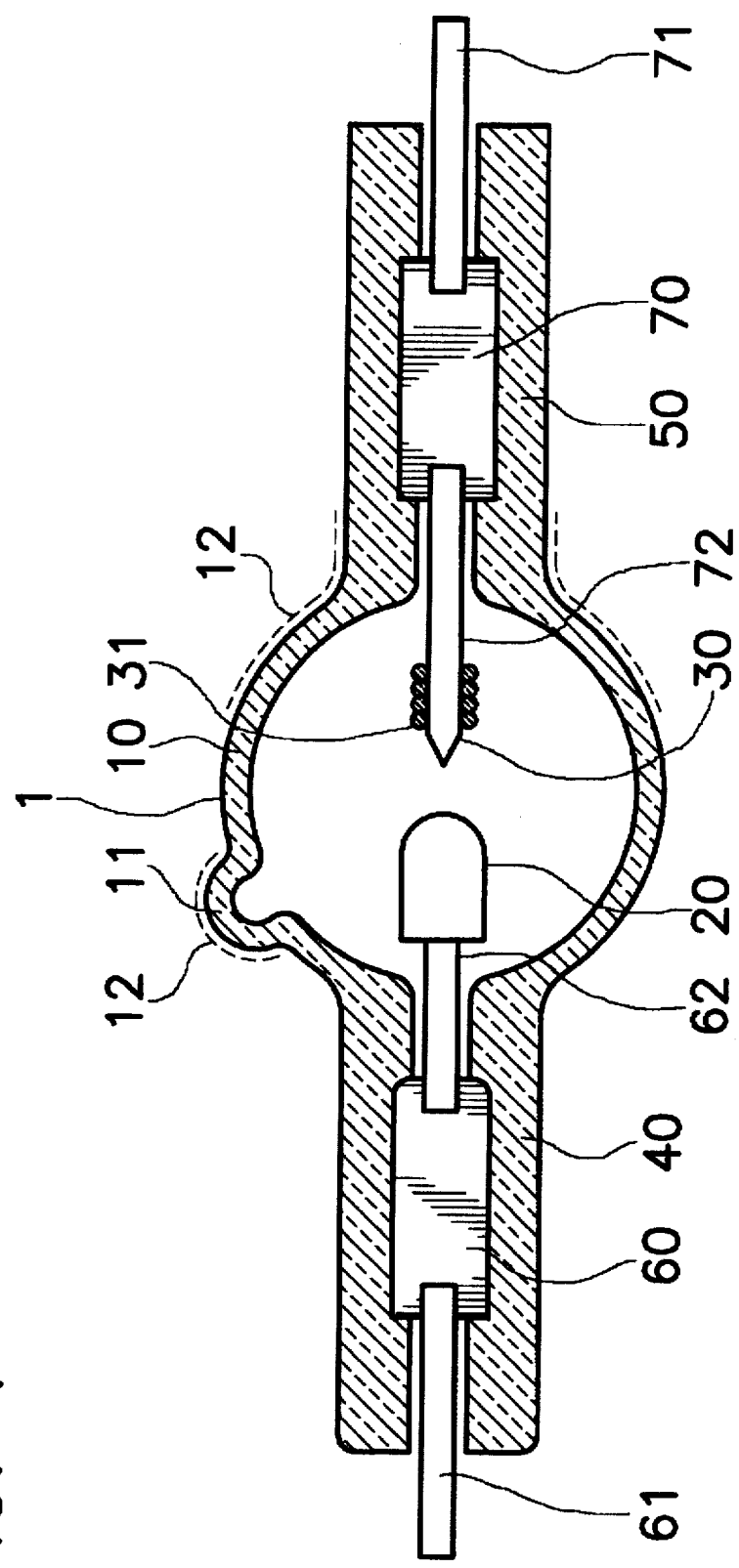
FIG. 1 shows a schematic of one embodiment of the discharge lamp according to the invention.

FIG. 1 schematically shows a discharge lamp according to the invention. In the figure, a quartz glass fluorescent tube 1 has an emission part 10 formed in its center. Emission part 10 has a spherical shape, a spindle shape, a rugby ball shape or the like, and an anode 20 and a cathode 30 are arranged opposite one another within emission part 10 along an axis of fluorescent tube 1 at a predetermined distance from each other of, for example, 3 mm. The internal volume of emission part 10 is computed by subtracting the volumes of anode 20 and cathode 30 from the interior volume of the emission part by itself, and is, for example, 100 cc.

On both sides of emission part 10 are located hermetically sealed parts 40 and 50, within each of which a respective metal foil 60, 70 is inserted connected to which a respective outer electrical lead 61, 71, and a respective inner electrical lead 62, 72.

Anode 20 is located on an inner end of the inner lead 62 and cathode 30 is located on the inner end of inner lead 72. These electrodes are made mainly of tungsten. Furthermore, the tip of anode 20 is spherically shape on a side facing the cathode 30 in order to reliably discharge the arc between these electrodes. The tip of cathode 30 facing the anode 20, in contrast, is of a conical shape. Furthermore, cathode 30 is wound with tungsten wire 31 to reduce the cathode temperature during luminous operation of the lamp.

A residue 11 of a gas charging tube which was used in manufacture of the lamp is located on the emission part 10. A heat insulating film 12 is applied to the outer surface of emission part 10 at a cathode-side base of emission part 10 as well as over residue 11. The reason for this is to prevent condensation of the encapsulated material within emission part 10 as the result of a reduced temperature at the cathode side during luminous operation of the lamp.

The quartz glass which forms fluorescent tube 1 contains the OH radical as is described below.

Mercury and inert gas are encapsulated within emission part 10. The amount of the mercury encapsulated is, for example, 20 mg/cm$^3$. As an inert gas, xenon gas is encapsulated in the amount of 0.5×10$^5$ Pa.

In a mercury lamp, generally, an inert gas, such as xenon gas or the like, is encapsulated to improve the warm-up characteristics when luminous operation begins. The amount of the inert gas encapsulated in this case is at most 1×10$^5$ Pa.

According to the invention, however, inert gas is used not only to improve warm-up characteristics, but also to produce an excimer state during luminous operation of the lamp by the xenon mixing with the mercury to a certain extent. Furthermore, the inert gas is used to emit light with shorter wavelengths than in a conventional lamp by positive use of emission from this excimer state and emission by mercury molecules, mercury ions or the like which form in conjunction with the excimer state.

Additionally, by setting the relative encapsulated amounts of the mercury and the inert gas, a quantitative ratio between the molecules of the mercury and the xenon in the above described excimer state, the mercury molecules and the mercury ions is established during luminous operation of the lamp, by which the radiation wavelength to be achieved is obtained.

For the above described reasons, by fixing the encapsulated amount of the inert gas and mercury to the set range described below, and thus, by the encapsulated mount of the inert gas and the vapor pressure of the mercury in luminous operation, light can be emitted with wavelengths in the range of 250 nm with high efficiency.

The above described encapsulated amounts influence the radiation intensity dependent upon the room temperature during encapsulation. Therefore, as the conventional average room temperature, a temperature of 25° C. is defined as the reference temperature. The expression "light with wavelengths in the range of 250 nm" is defined here specifically as light with wavelengths from 240 to 254 nm, and in this range emission with continuous radiation spectra is accomplished.

This discharge lamp is operated, for example, using direct current with a nominal voltage of roughly 30 V, a nominal current of roughly 70 A, and a nominal power of 2000 W. It is not restricted to these nominal values, but the invention can be used advantageously also for a discharge lamp with a luminous power of roughly 50 to 8000 W and furthermore for a lamp with 1500 to 3000 W.

Mercury and the inert gas are the only encapsulated gases. The temperature of the outer surface of the fluorescent tube during luminous operation is 300° to 1000° C.

The table in FIG. 2 shows the relationship between the OH radical content of the quartz glass and illumination intensity. In this case, a lamp with the same configuration as the above described lamp was used in which, within the quartz glass fluorescent tube a pair of electrodes is located adjacent to one another and the mercury and the inert gas are encapsulated. Some lamps with different OH radical concentrations in the quartz glass were produced and the illumination intensity of light in the wavelength range of 240 nm to 254 nm was measured. Specifically, the OH radical concentration of seven lamps (a) through (g) shown in the drawing was changed in a weight ratio from 0.5 to 900 weight-ppm.

In the test, the illumination intensity which is emitted after 100 hours of lamp operation was measured and which, however, is specifically an integrated value, that is, a total value of the illumination intensity of each wavelength in the wavelength range from 240 nm to 254 nm. The illumination intensity in this case was shown such that a lamp in which the OH radical concentration is a weight of 700 ppm was designated 1 and the intensity values for other lamps were represented as a percentage of that intensity.

This makes it clear that when the concentration of the OH radical contained in the quartz glass is greater than or equal to 300 weight-ppm, the same radiation intensity can be obtained as at a weight of 700 ppm for the reference OH radical concentration. This means that, when using quartz glass with an OH radical concentration that is greater than or equal to 300 weight-ppm, sufficient radiation intensity is obtained and luminous operation can be continued over a long time without attenuation of the light of wavelengths from 240 nm to 254 nm. On the other hand, the emission of water, hydrogen or the like which are contained in the OH radical at greater than or equal to 900 ppm was more vigorous; this caused the fluorescent tube to become black.

Consequently, it was found that it is desirable that the quartz glass contain the OH radical at a weight of 300 to 800 ppm.

In this test, as the designation of the illumination intensity, the OH radical concentration was assumed as the reference at a weight of 700 ppm. However, using any OH radical concentration as a reference, the same result can be obtained with regard to the efficacy of having the OH radical concentration of a weight of 300 to 800 ppm.

The "quartz glass" to which the above applies is not only that forming the spherical emission part, but all of the glass forming the lamp 1 including the hermetically sealed parts 40, 50. However, the above findings are not limited to the case in which the OH radical is present in a uniform manner over the entire area of the fluorescent tube of the lamp, and includes the circumstance where the OH radical concentration differs between that in the emission part and that in the hermetically sealed parts. In such a case, it is the ratio of the content of the OH radical only in the emission part without the hermetically sealed parts that is applicable. Furthermore, the OH radical concentration is changed slightly according to the luminous operation of the lamp, the measure of the change being simple with respect to industrial applications.

FIG. 3 shows the relationship between the concentration of the metallic impurities contained in the quartz glass and the illumination intensity of the lamp. In the lamp, within the quartz glass fluorescent tube, a pair of electrodes is located adjacent to one another and the mercury and the inert gas are encapsulated. Some lamps with different concentrations of the metallic impurities contained in the quartz glass have been produced and the illumination intensity of the light emitted from each lamp was measured. The content of OH radical contained in the quartz glass is a weight of 300 ppm. Specifically, the concentration of the metallic impurities contained in the quartz glass of the five lamps (h) through (l) which are shown in the drawing was changed in a weight ratio from 0.5 to 30 weight-ppm.

In the test, the illumination intensity was measured after 100 hours of lamp operation; however, it is specifically an integrated value, that is, the total value of the illumination intensity of each wavelength in the wavelength range from 240 nm to 254 nm. The illumination intensity in this case is shown with numerical values, such that the illumination intensity which is emitted from a lamp in which the concentration of metallic impurities is a weight of 1.0 ppm was designated 1 and the illumination intensity from other lamps was shown as a percentage thereof. The results show a sufficient radiation intensity can be maintained, as in the case of a concentration of metallic impurities of 1.0 weight-ppm, at lower values but not at greater OH concentration weights.

Consequently, luminous operation over a long time can be accomplished without attenuating the light in the wavelength range from 240 nm to 254 nm if the concentration of metallic impurities contained in the quartz glass is a weight of less than or equal to 1.0 ppm. On the other hand, at greater than or equal to 1.0 weight-ppm the attenuation coefficient of the radiant light becomes high and the lamp cannot be used for industrial applications. The reason for this is presumably that the atoms and molecules of the metallic impurities contained in the quartz glass cause vibrations which influence the transmitted radiant light at a high temperature of 800° to 1000° C. during luminous operation of the lamp.

Next, the ratio between the encapsulation amount of the mercury and the inert gas which are contained in the emission part and the illumination intensity in a wavelength range from 240 to 254 nm is shown. In the lamp, within the quartz glass fluorescent tube, a pair of electrodes is located adjacent to one another, and mercury and the inert gas xenon are encapsulated. The encapsulated amounts of mercury and the inert gas were changed, and the illumination intensity of the light in the wavelength range from 240 nm to 254 nm was measured. FIG. 4 shows the result.

Specifically, the encapsulated amounts of the mercury and the xenon of 10 lamps (1) through (10) shown in the drawing were changed and the lamps were operated with an illumination voltage of roughly 30 V, an illumination current of roughly 70 A and an illumination power of roughly 2 KW.

The illumination intensity was measured by measuring the radiant light from each lamp by means of a spectroscope which was calibrated by a halogen lamp and a deuterium lamp. The spectroscope output was converted into voltage values via photomultiplier tubes and evaluated.

In the representation, the relative radiant exposure intensity designates the overall value of the illumination intensity of each wavelength in the wavelength range from 240 nm to 254 nm and the relative luminous efficiency, a value which is obtained when the relative radiant exposure density is divided by the luminous power of the lamp. This means that, in this case, the ratio between the illumination intensity and the illumination power is shown, for which it is illustrated that, in lamps with a large numerical value thereof, a large illumination intensity can be obtained at a low power.

In the representation, lamps with a relative illumination efficiency at least equal to 45 is considered acceptable. The reason for this is that, in the case of a relative illumination efficiency value of less than 45, a semiconductor cannot be adequately exposed. This indicates that it is advantageous if the amount of mercury encapsulated is 14 to 30 mg/cm$^3$ and the xenon is at a pressure of $0.1 \times 10^5$ Pa to $5 \times 10^5$ Pa. With respect to the inert gas, the test was run using xenon. However, the same result can be also obtained in a test using krypton. Furthermore, it was confirmed that with respect to the argon, use in an encapsulated pressure range from 0.03 to $10^5$ Pa to $5 \times 10^5$ Pa is effective.

Lastly, the concentration of the OH radical of the quartz glass is fixed at a range from 300 to 800 weight-ppm, and at the same time, the concentration of metallic impurities is fixed at less than or equal to 1 weight-ppm. Furthermore, an endurance test was run using a lamp in which mercury in an amount of 14 mg to 30 mg/cm$^3$ of fluorescent tube internal volume and xenon in an amount of $0.1 \times 10^5$ to $5.0 \times 10^5$ Pa at a reference temperature of 25° C. were encapsulated in the fluorescent tube.

Consequently, it was confirmed that, in a luminous operation with 2 KW, the intensity of light in the wavelength range from 240 nm to 254 nm with uninterrupted luminous operation of at least 400 hours maintains essentially the same uniform value as at the start of luminous operation and is not a barrier in practice for industrial applications.

Figure 5:
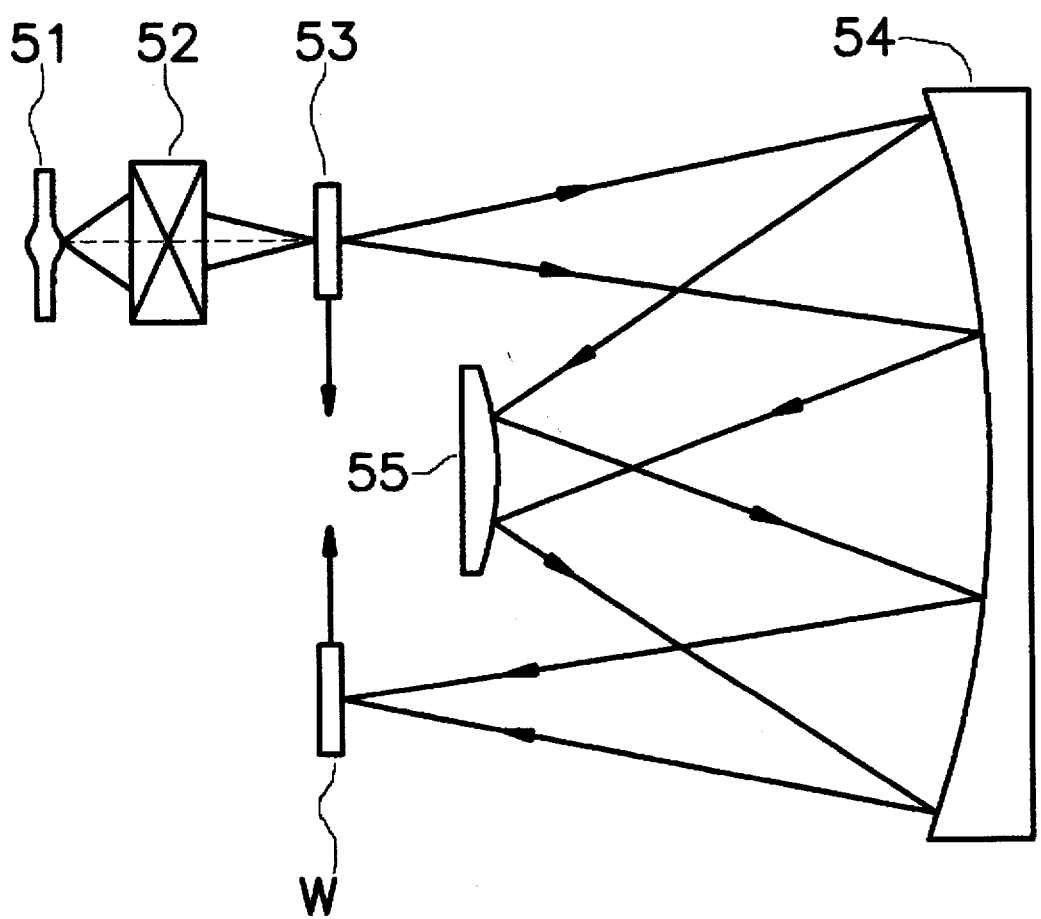
FIG. 5 shows a schematic depiction of an exposure device in which the discharge lamp according to the present invention is used.

FIG. 5 shows an exposure device using the lamp according to the invention. The radiant light of mercury lamp 51 irradiates mask 53 via condenser lens 52. The light passes through a circuit pattern of mask 53, is deflected by means of concave mirror 54 and convex mirror 55, and exposes wafer W. In this exposure device, the alignment accuracy can be increased since mask 53 and wafer W are moved by a coupling. The discharge lamp according to the invention, however, can be used not only for the exposure device shown in FIG. 5, but also for exposure systems such as contact systems and proximity systems.

It is to be understood that although a preferred embodiment of the invention has been described, various other embodiments and variations may occur to those skilled in the art. Any such other embodiments and variations which fall within the scope and spirit of the present invention are intended to be covered by the following claims.

We claim:

1. A discharge lamp comprising a pair of electrodes located with a discharge gap formed therebetween, mercury and an inert gas encapsulated within a tube made of quartz glass; wherein said quartz glass has an OH radical concentration of a weight of 300 to 800 ppm.

2. A discharge lamp according to claim 1, wherein said quartz glass has a concentration of metallic impurities of a weight $\leq 1$ ppm.

3. A discharge lamp according to claim 2, wherein said mercury is encapsulated in an amount of 14 mg to 30 mg cm$^3$ of tube internal volume; and wherein the inert gas is selected from the group consisting of xenon and krypton, and has an encapsulated pressure of $0.1 \times 10^5$ Pa to $5.0 \times 10^5$ Pa at reference temperature of 25° C.

4. A discharge lamp according to claim 2, wherein said mercury is encapsulated in an amount of 14 mg to 30 mg cm$^3$ of tube internal volume; and wherein the inert gas is argon and has an encapsulated pressure of $0.03 \times 10^5$ Pa to $5.0 \times 10^5$ Pa at reference temperature of 25° C.

5. A discharge lamp according to claim 1, wherein said mercury is encapsulated in an amount of 14 mg to 30 mg cm$^3$ of tube internal volume; and wherein the inert gas is selected from the group consisting of xenon and krypton, and has an encapsulated pressure of $0.1 \times 10^5$ Pa to $5.0 \times 10^5$ Pa at reference temperature of 25° C.

6. A discharge lamp according to claim 1, wherein said mercury is encapsulated in an amount of 14 mg to 30 mg cm$^3$ of tube internal volume; and wherein the inert gas is argon and has an encapsulated pressure of $0.03 \times 10^5$ Pa to $5.0 \times 10^5$ Pa at reference temperature of 25° C.

* * * * *